(12) United States Patent
Abrahamson et al.

(10) Patent No.: US 8,015,701 B2
(45) Date of Patent: Sep. 13, 2011

(54) METHOD OF MANUFACTURING A FLEXIBLE PRINTED CIRCUIT ASSEMBLY

(75) Inventors: Paul V. Abrahamson, Ham Lake, MN (US); John Richard Dangler, Rochester, MN (US); Daniel Lee Dawiedczyk, Woodbury, MN (US); Matthew Stephen Doyle, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 798 days.

(21) Appl. No.: 12/035,683

(22) Filed: Feb. 22, 2008

(65) Prior Publication Data

US 2009/0211792 A1    Aug. 27, 2009

(51) Int. Cl.
*H05K 3/20* (2006.01)

(52) U.S. Cl. ............... 29/831; 29/830; 29/851; 174/259

(58) Field of Classification Search .................. 174/255, 174/256, 258, 259; 361/749; 29/830, 831, 29/846, 848, 851
See application file for complete search history.

(56) References Cited

U.S. PATENT DOCUMENTS 5,473,118 A * 12/1995 Fukutake et al. ............. 174/258
7,038,143 B2 * 5/2006 Utsumi et al. .................. 29/832

* cited by examiner

*Primary Examiner* — Donghai D. Nguyen
(74) *Attorney, Agent, or Firm* — Rabin & Berdo, PC

(57) ABSTRACT

A flexible printed circuit assembly with a fluorocarbon dielectric layer and an adhesive layer with reduced thickness. The flexible printed circuit assembly includes a first dielectric layer and a signal trace disposed on the first dielectric layer. An adhesive layer with a thickness smaller than a height of the signal trace is disposed on the first dielectric layer, so that only a portion of a side surface of the signal trace is covered. A second dielectric layer made of fluorocarbon is disposed on the adhesive layer, covering a remaining portion of the side surface of the signal trace and a top surface of the signal trace.

9 Claims, 1 Drawing Sheet

METHOD OF MANUFACTURING A FLEXIBLE PRINTED CIRCUIT ASSEMBLY

BACKGROUND OF THE INVENTION

1. Field of the Invention

The invention relates to a flexible printed circuit assembly, and in particular, to a flexible multilayer printed circuit assembly that effectively reduces dielectric loss and decreases overall construct thickness by using a fluorocarbon dielectric layer, and an adhesive layer after lamination that is thinner than a signal trace.

2. Background Information

As processing speeds and packaging densities have increased, traditional wire cables cannot meet the requirements of high-speed signal interconnections. Further, high-performance coax or optical fiber has drawbacks, such as, poor I/O density, a greater overall cost, lack of decoupling and DC distribution, and a greater consumption of precious physical space. Thus, flexible printed circuit assemblies have been developed for the high-speed interconnections between multiple computer processing units. These flexible printed circuit assemblies are high circuit density systems that can save space, can handle multiple conductive layers with their high circuit density, and can provide high-speed interconnections between multiple units. Because its flexibility is greater than a rigid printed circuit assembly, the flexible printed circuit assembly may be used where the assembly needs to be bent to interconnect computer units together. These benefits have increased the use of the flexible printed circuit assemblies in place of the traditional wire cables for computer processor interconnections.

A typical flexible printed circuit assembly has multiple conductive layers that are made of conductive material. Each conductive layer is separated by a dielectric layer. Generally, the conductive layers include ground layers used to provide a reference voltage plane or a logic ground plane. The flexible printed circuit further includes a signal trace made of conductive material, which is used to provide a high-speed signal interconnect, and an adhesive layer encompassing the signal trace.

FIG. 1 illustrates a conventional flexible printed circuit assembly 10 is provided. The flexible printed circuit assembly 10 includes a bottom copper ground layer 11, a first dielectric layer 12, a signal trace 13, a first adhesive layer 14, a second dielectric layer 15, a second adhesive layer 16 and a top copper ground layer 17. Both the signal trace 13 and the first adhesive layer 14 are disposed on the top surface of the first dielectric layer 12. The adhesive layer 14 bonds the second dielectric layer 15 to the first dielectric layer 12.

As shown in FIG. 1, the adhesive layer 14 is typically thicker than the signal trace 13, with the signal trace 13 being encased within the adhesive layer 14. Accordingly, the adhesive layer 14 fully encompasses the signal trace 13, and surrounds the entire side surface of the signal trace 13, also covering a top surface of the signal trace 13. While this structure of the adhesive layer 14 provides a manufacturable and reliable flexible printed circuit assembly 10, the adhesive layer 14 is typically made of a bonding material with a relatively large dielectric loss tangent, which attenuates energy from the propagating signal from the signal trace 13. The bonding material may be epoxy resin, acrylic, silicone, polyurethane, or any other adhesive material.

Dielectric loss tangent is a constant that determines the "lossiness" of a certain material. A low dielectric loss tangent results in a low loss material, allowing a high-speed interconnect, while a large dielectric loss tangent results in a high loss material or a significant attenuation material, allowing a relatively low-speed interconnect. The amount of dielectric loss may be determined by the amount of material surrounding the signal trace 13, and the dielectric loss tangent of the surrounding material. In this context, because the adhesive layer 14 entirely covers the signal trace 13, the most significant dielectric loss contributor for the signal trace 13 is the adhesive layer 14, i.e., the thickness of the adhesive layer 14 and the magnitude of its dielectric loss tangent. Because of the relatively large dielectric loss tangent and thickness of the adhesive layer 14, the flexible printed circuit assembly 10 may not be suited for high-speed applications. Further, due to the thick adhesive layer 14, the flexible printed circuit assembly 10 has an increased overall construct thickness, bringing about less mechanical flexibility.

Further, both the first and second dielectric layers 12 and 15 are typically made of the same material, such as Kapton™, polyimide, or any other dielectric material, which makes it difficult to enhance the dielectric loss characteristics of the flexible printed circuit assembly 10.

SUMMARY OF THE INVENTION

Accordingly to one aspect of the invention, a flexible printed circuit assembly that incorporates a thinner adhesive and a dielectric layer with a low dielectric loss tangent is provided. The flexible printed circuit assembly includes a bottom ground layer, a first dielectric layer, a signal trace, an adhesive layer, and a second dielectric layer. The flexible printed circuit assembly may further include a further adhesive layer and a top ground layer. The first dielectric material is disposed on the bottom ground layer. The signal trace is disposed on a top surface of the first dielectric material, and may be made of copper or other metal, or any other conductive material. The adhesive layer is also disposed on the top surface of the first dielectric material, and may be made of epoxy resin, acrylic, silicone, polyurethane, or any other bonding material.

In another exemplary aspect of the invention, the adhesive layer has a thickness smaller than a height of the signal trace, and, thus, surrounds only a partial portion of a side surface of the signal trace.

In a further exemplary aspect of the invention, the second dielectric layer is disposed on, so as to be in direct contact with, both the adhesive layer and the signal trace. The signal trace protrudes into the second dielectric layer, and covers the remaining portion of the side surface of the signal trace that is not surrounded by the adhesive layer.

In a further exemplary aspect of the invention, the second dielectric layer may be made of fluorocarbon or other material that has a dielectric loss tangent much smaller than that of any bonding material forming the adhesive layer. The combination of the thinner adhesive layer and the second dielectric material with a small dielectric loss tangent, reduces the dielectric loss, decreases an overall thickness of the assembly, and improves its mechanical flexibility.

DETAILED DESCRIPTION OF THE PREFERRED EMBODIMENTS

The invention will now be described in more detail by way of example with reference to the embodiments shown in the accompanying figures. It should be kept in mind that the following described embodiments are only presented by way of example and should not be construed as limiting the inventive concept to any particular physical configuration.

Further, if used and unless otherwise stated, the terms "upper", "lower", "front", "back", "over", "under", and similar such terms are not to be construed as limiting the invention to a particular orientation. Instead, these terms are used only on a relative basis.

Figure 1:
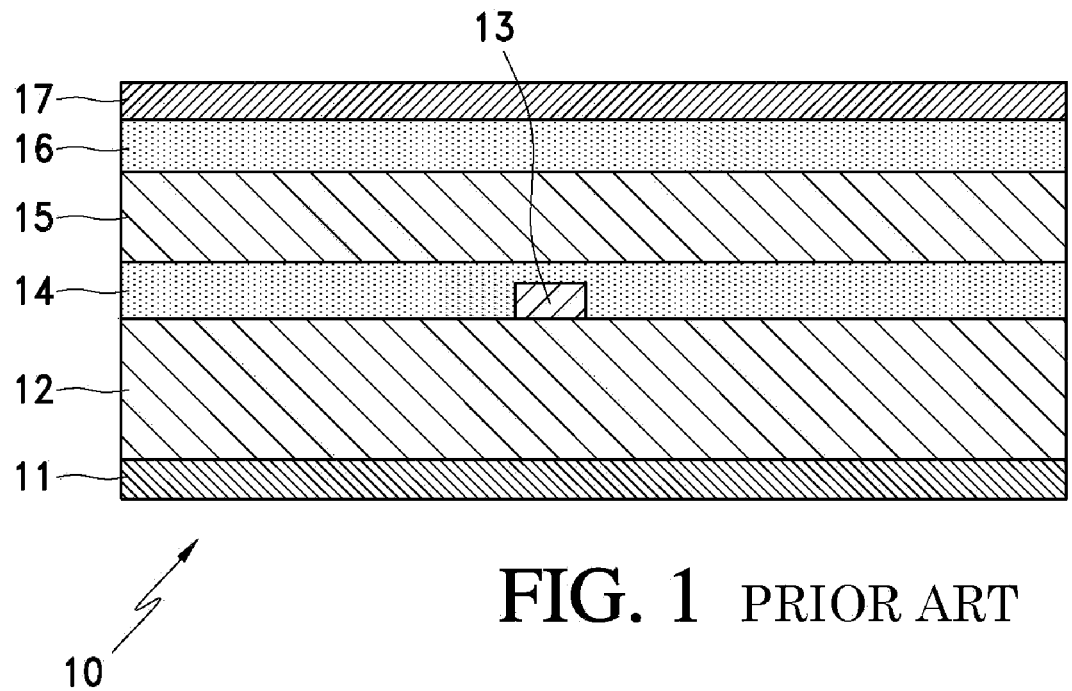
FIG. 1 is a schematic cross-sectional view of a conventional flexible printed circuit assembly.
Figure 2:
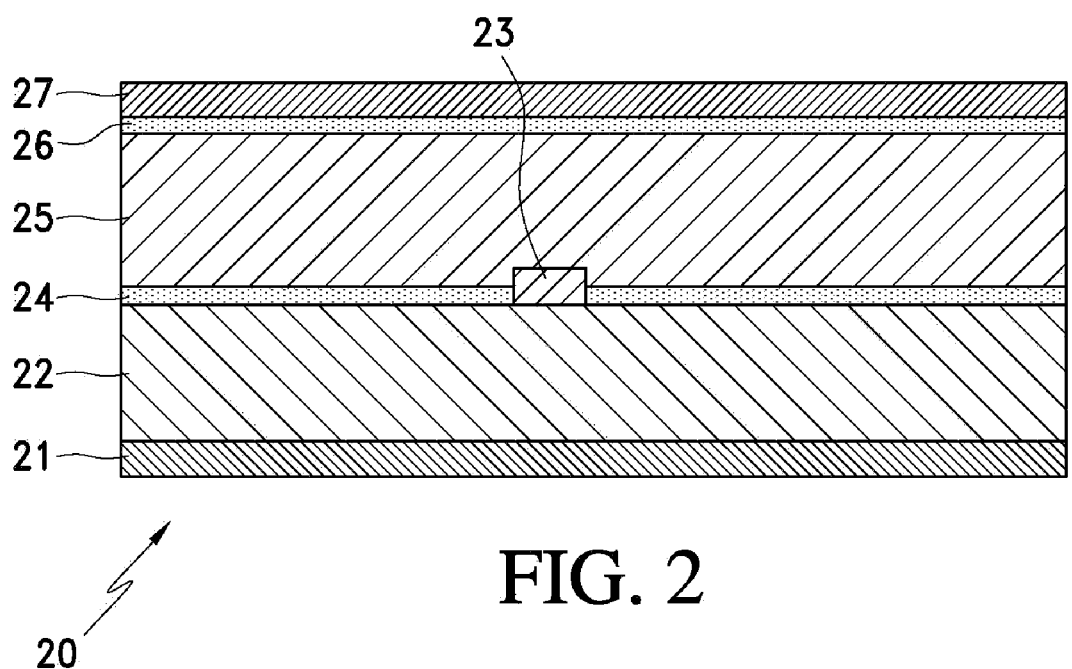
FIG. 2 is a schematic cross-sectional view of a flexible printed circuit assembly, according to an exemplary embodiment of the present invention.

FIG. 2 is a schematic cross-sectional view of a flexible printed circuit assembly 20, according to an exemplary embodiment of the present invention. The flexible printed circuit assembly 20 may have a similar layer structure of the assembly 10, as shown in FIG. 1. Referring to FIG. 2, the flexible printed circuit assembly 20 includes a bottom ground layer 21, a first dielectric layer 22, a signal trace 23, an adhesive layer 24, a second dielectric layer 25, a further adhesive layer 26 and a top ground layer 27.

The bottom ground layer 21 may be made of copper or other metal, or any other conductive material. The first dielectric material 22 is disposed on the bottom ground layer 21, and may be made of Kapton™, polyimide, or any other dielectric material.

The signal trace 23 is disposed on a top surface of the first dielectric material 22, and may be made of copper or other metal, or any other conductive material.

The adhesive layer 24 is also disposed on the top surface of the first dielectric material 22, and may be made of epoxy resin, acrylic, silicone, polyurethane, or any other bonding material. The adhesive layer 24 has a thickness smaller than a height of the signal trace 23, and, thus, surrounds only a partial portion of a side surface of the signal trace 23.

The second dielectric layer 25 is disposed on, so as to be in direct contact with, both the adhesive layer 24 and the signal trace 23. Because the height of the signal trace 23 is larger than the thickness of the adhesive layer 24, the signal trace 23 protrudes into the second dielectric layer 25. The second dielectric layer 25 surrounds the remaining portion of the side surface of the signal trace 23 that is not surrounded by the adhesive layer 24.

The second dielectric layer 25 may be made of fluorocarbon, such as perfluoroalkoxy copolymer (PFA), fluorinated ethylene propylene (FEP), or any other fluorocarbon material. The dielectric loss tangent of fluorocarbon is much smaller than that of any bonding material forming the adhesive layer 24.

Because the adhesive layer 24 and the second dielectric layer 25 collectively surround the side surface of the signal trace 23, the dielectric loss of the signal from the signal trace 23 is determined by the dielectric loss tangent of the material forming the adhesive layer 24 and the dielectric loss tangent of the material forming the second dielectric layer 25. Here, the second dielectric layer 25 is made of fluorocarbon that has loss tangent substantially smaller than that of the adhesive layer 24. For example, the loss tangent of the fluorocarbon may be much less than one fifth of the loss tangent of the epoxy resin or acrylic adhesive forming the adhesive layer 24.

Further, the loss tangent of the fluorocarbon is also substantially less than the loss tangent of Kapton™, polyimide, or other material forming the first dielectric layer 22. Thus, the second dielectric layer 25 made of fluorocarbon may provide an enhanced electrical performance characteristics to the flexible printed circuit 20, compared with the conventional flexible printed circuit having the second dielectric made of the same material as the first dielectric layer 22.

However, the second dielectric layer 25 is not limited to fluorocarbon, but may be formed of a different dielectric material with a dielectric loss tangent substantially smaller than the adhesive layer 24. According to another exemplary embodiment of the invention, the second dielectric layer 25 may be formed by any dielectric material that has a dielectric loss tangent substantially smaller than the material forming the adhesive layer 24 and the material forming the first dielectric layer 22, as long as it can be sufficiently bonded to the adhesive layer 24.

A further adhesive layer 26 may be disposed on the second dielectric layer 25, and may be made of epoxy resin, acrylic, silicone, polyurethane, or any other bonding material. The top ground layer 27 is disposed on the adhesive layer 26, and may be made of copper or other metal, or any other conductive material. The adhesive layer 26 bonds the top ground layer 27 to the second dielectric layer 25. However, the flexible printed circuit assembly 20 of the invention may be formed without the top ground layer and the corresponding adhesive layer 26.

The combination of the adhesive layer 24 that is thinner than the signal trace 23, and the second dielectric material 25 yields a product with enhanced electrical performance characteristics. The second dielectric material 25 made of fluorocarbon or other material with a low dielectric tangent covers both the top surface of the signal trace 23 and at least a portion of the side of the signal trace 23, thereby reducing the dielectric loss. Further, the flexible printed circuit assembly 20 according to the invention allows a measurable reduction in the volume of the first adhesive layer 24 in the area of the signal trace 23, thereby decreasing an overall thickness of the assembly 20 and improving its mechanical flexibility.

It should be understood, however, that the invention is not necessarily limited to the specific arrangement and components shown and described above, but may be susceptible to numerous variations within the scope of the invention.

It will be apparent to one skilled in the art that the manner of making and using the claimed invention has been adequately disclosed in the above-written description of the preferred embodiments taken together with the drawings. It will be understood that the above description of the preferred embodiments of the present invention are susceptible to various modifications, changes, and adaptations, and the same are intended to be comprehended within the meaning and range of equivalents of the appended claims.

What is claimed is:

1. A method of manufacturing a flexible printed circuit assembly, comprising:
   providing a ground layer;
   providing a dielectric layer on the ground layer;
   providing a signal trace on the dielectric layer;
   providing an adhesive layer on the dielectric layer and adjacent to the signal trace, the adhesive layer having a thickness smaller than a height of the signal trace; and
   providing a fluorocarbon layer disposed on and bonded to the adhesive layer,
   wherein a side surface of the signal trace includes a lower part that is covered by and in direct contact with the adhesive layer and an upper part that is covered by and in direct contact with the fluorocarbon layer, with the adhesive layer not being in contact with the upper part of the side surface of the signal trace, and
   wherein a top surface of the signal trace is covered by and in direct contact with the fluorocarbon layer, with the adhesive layer not being in contact with the top surface of the signal trace.

2. The method of claim 1, wherein the signal trace protrudes into the fluorocarbon film.

3. The method of claim 1, further comprising providing a further ground layer disposed on the fluorocarbon layer.

4. The method of claim 3, further comprising providing a further adhesive layer disposed between the further ground layer and the fluorocarbon layer.

5. The method of claim 1, wherein the fluorocarbon layer includes perfluoroalkoxy copolymer.

6. The method of claim 1, wherein the fluorocarbon layer includes fluorinated ethylene propylene.

7. The method of claim 1, wherein the adhesive layer is comprised of an adhesive material selected from the group consisting of epoxy resin, acrylic, silicone, and polyurethane.

8. The method of claim 1, wherein the dielectric layer is comprised of polyimide or other dielectric materials.

9. The method of claim 1, wherein the signal trace is comprised of copper or other conductive material.

* * * * *